(12) United States Patent
Liu et al.

(10) Patent No.: US 11,563,195 B2
(45) Date of Patent: Jan. 24, 2023

(54) STRETCHABLE DISPLAY PANEL HAVING ENCAPSULATED ISLANDS WITH LIGHT EMITTING ELEMENTS ON STRETCHABLE BASE SUBSTRATE, STRETCHABLE DISPLAY APPARATUS, AND METHODS OF FABRICATING STRETCHABLE DISPLAY PANEL HAVING THE SAME

(71) Applicant: BOE Technology Group Co., Ltd., Beijing (CN)

(72) Inventors: Wenqi Liu, Beijing (CN); Zhongyuan Sun, Beijing (CN); Guangcai Yuan, Beijing (CN); Jinxiang Xue, Beijing (CN); Guoqiang Wang, Beijing (CN); Chao Dong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 327 days.

(21) Appl. No.: 16/639,494

(22) PCT Filed: Apr. 10, 2019

(86) PCT No.: PCT/CN2019/082076
§ 371 (c)(1),
(2) Date: Feb. 14, 2020

(87) PCT Pub. No.: WO2020/206636
PCT Pub. Date: Oct. 15, 2020

(65) Prior Publication Data
US 2021/0135154 A1    May 6, 2021

(51) Int. Cl.
*H01L 51/52* (2006.01)
*H01L 51/00* (2006.01)
*H01L 51/56* (2006.01)

(52) U.S. Cl.
CPC ........ *H01L 51/5253* (2013.01); *H01L 51/003* (2013.01); *H01L 51/5246* (2013.01); *H01L 51/56* (2013.01); *H01L 2251/5338* (2013.01)

(58) Field of Classification Search
CPC ............... H01L 51/5253; H01L 51/003; H01L 51/5246
See application file for complete search history.

(56) References Cited

U.S. PATENT DOCUMENTS

| | | | |
|---|---|---|---|
| 9,391,286 B1* | 7/2016 | Kwon | H01L 51/5275 |
| 10,461,142 B2* | 10/2019 | Hong | H01L 51/0096 |
| 2017/0279057 A1* | 9/2017 | Park | H01L 51/5256 |
| 2019/0341433 A1* | 11/2019 | Im | H01L 51/524 |

* cited by examiner

*Primary Examiner* — Michael Jung
(74) *Attorney, Agent, or Firm* — Intellectual Valley Law, P.C.

(57) ABSTRACT

A stretchable display panel having a plurality of encapsulated islands and a plurality of bridges connecting the plurality of encapsulated islands is provided. The stretchable display panel includes a stretchable base substrate; a flexible base wall on the stretchable base substrate, the flexible base wall substantially enclosing a substantially enclosed space; an adhesive layer on the stretchable base substrate and substantially enclosed in the substantially enclosed space; and a plurality of light emitting elements on a side of the adhesive layer away from the stretchable base substrate. A respective one of the plurality of encapsulated islands includes at least one of the plurality of light emitting elements encapsulated therein on the stretchable base substrate.

12 Claims, 8 Drawing Sheets

STRETCHABLE DISPLAY PANEL HAVING ENCAPSULATED ISLANDS WITH LIGHT EMITTING ELEMENTS ON STRETCHABLE BASE SUBSTRATE, STRETCHABLE DISPLAY APPARATUS, AND METHODS OF FABRICATING STRETCHABLE DISPLAY PANEL HAVING THE SAME

CROSS-REFERENCE TO RELATED APPLICATION

This application is a national stage application under 35 U.S.C. § 371 of International Application No. PCT/CN2019/082076, filed Apr. 10, 2019, the contents of which are incorporated by reference in the entirety.

TECHNICAL FIELD

The present invention relates to display technology, more particularly, to a stretchable display panel, a stretchable display apparatus, and a method of fabricating a stretchable display panel.

BACKGROUND

Flexible electronic apparatuses and stretchable electronic apparatuses have been developed in recent years. Flexible electronic apparatuses are apparatuses that may be bent or folded, typically fabricated by mounting an electronic device on a flexible base substrate. Stretchable electronic apparatuses are apparatuses that allows its length to be increased in one or more dimensions. Stretchable electronic apparatuses may be useful in various applications including in display apparatuses and sensor arrays.

SUMMARY

In one aspect, the present invention provides a stretchable display panel having a plurality of encapsulated islands and a plurality of bridges connecting the plurality of encapsulated islands, comprising a stretchable base substrate; a flexible base wall on the stretchable base substrate, the flexible base wall substantially enclosing a substantially enclosed space; an adhesive layer on the stretchable base substrate and substantially enclosed in the substantially enclosed space; and a plurality of light emitting elements on a side of the adhesive layer away from the stretchable base substrate; wherein a respective one of the plurality of encapsulated islands comprises at least one of the plurality of light emitting elements encapsulated therein on the stretchable base substrate.

Optionally, the plurality of encapsulated islands and the plurality of bridges constitute a connected network; the flexible base wall is in a perimeter of the connected network, forming the substantially enclosed space extending throughout the connected network; and the adhesive layer is in the substantially enclosed space extending throughout the connected network.

Optionally, the stretchable display panel has a plurality of gaps respectively between adjacent encapsulated islands of the plurality of encapsulated islands, the adhesive layer is absent in the plurality of gaps; and a respective one of the plurality of gaps is surrounded by a portion of the flexible base wall.

Optionally, the stretchable display panel further comprises an encapsulating layer encapsulating the plurality of encapsulated islands and the plurality of bridges.

Optionally, the encapsulating layer substantially covers an outer lateral side of the flexible base wall.

Optionally, the stretchable base substrate extends throughout an entirety of the stretchable display panel.

Optionally, the stretchable display panel further comprises a flexible base pattern on a side of the adhesive layer away from the stretchable base substrate; wherein the flexible base wall, the flexible base pattern, and the stretchable base substrate substantially enclose the adhesive layer in the substantially enclosed space.

Optionally, the flexible base pattern and the flexible base wall constitute a unitary structure and comprise a same material.

In another aspect, the present invention provides a stretchable display apparatus, comprising the stretchable display panel described herein or fabricated by a method described herein, and one or more integrated circuits connected to the stretchable display panel.

In another aspect, the present invention provides a method of fabricating a stretchable display panel having a plurality of encapsulated islands and a plurality of bridges connecting the plurality of encapsulated islands, comprising forming a flexible base wall on a stretchable base substrate, the flexible base wall formed to substantially enclose a substantially enclosed space; forming an adhesive layer on the stretchable base substrate, the adhesive layer formed to be substantially enclosed in the substantially enclosed space; and forming a plurality of light emitting elements, the plurality of light emitting elements formed on a side of the adhesive layer away from the stretchable base substrate; wherein a respective one of the plurality of encapsulated islands comprises at least one of the plurality of light emitting elements encapsulated therein on the stretchable base substrate.

Optionally, the plurality of encapsulated islands and the plurality of bridges are formed to constitute a connected network; the flexible base wall is formed in a perimeter of the connected network, forming the substantially enclosed space extending throughout the connected network; and the adhesive layer is formed in the substantially enclosed space extending throughout the connected network.

Optionally, the method further comprises forming a plurality of gaps respectively between adjacent encapsulated islands of the plurality of encapsulated islands; wherein the adhesive layer is absent in the plurality of gaps; and a respective one of the plurality of gaps is formed to be surrounded by a portion of the flexible base wall.

Optionally, prior to forming the flexible base wall, the method further comprises forming a flexible material layer on a first rigid base substrate; forming the plurality of light emitting elements on the flexible material layer, the plurality of light emitting elements formed in regions corresponding to the plurality of encapsulated islands, thereby forming an intermediate substrate comprising the plurality of light emitting elements; and etching through a plurality of layers of the intermediate substrate including the flexible material layer in regions between the adjacent encapsulated islands of the plurality of encapsulated islands, thereby forming a plurality of gap regions corresponding to the plurality of gaps.

Optionally, subsequent to etching through the plurality of layers of the intermediate substrate, the method further comprises forming an encapsulating layer encapsulating the plurality of encapsulated islands and the plurality of bridges.

Optionally, the flexible material layer is etched to form an etched flexible material layer during etching through the plurality of layers of the intermediate substrate; and the encapsulating layer is formed to substantially cover an outer lateral side of the etched flexible material layer.

Optionally, subsequent to forming the encapsulating layer, the method further comprises forming a sacrificial layer on a side of the encapsulating layer away from the first rigid base substrate; and adhering a side of the sacrificial layer away from the first rigid base substrate to a second rigid base substrate.

Optionally, the flexible material layer is etched to form an etched flexible material layer during etching the intermediate substrate; the etched flexible material layer substantially covers regions corresponding to the plurality of encapsulated islands and the plurality of bridges; and wherein, subsequent to adhering the side of the sacrificial layer away from the first rigid base substrate to the second rigid base substrate, the method further comprises separating the etched flexible material layer from the first rigid base substrate, thereby exposing a surface of the etched flexible material layer; and subsequent to exposing the surface of the etched flexible material layer, etching the etched flexible material layer to form a flexible base wall substantially enclosing a substantially enclosed space; wherein forming the adhesive layer comprises filling an adhesive in the substantially enclosed space; and attaching the stretchable base substrate to the adhesive in the substantially enclosed space.

Optionally, the etched flexible material layer is etched incompletely through a thickness of the etched flexible material layer, thereby forming the flexible base wall and a flexible base pattern enclosing the substantially enclosed space; wherein the flexible base pattern is formed on a side of the adhesive layer away from the stretchable base substrate, the flexible base wall, the flexible base pattern, and the stretchable base substrate substantially enclosing the adhesive layer in the substantially enclosed space.

Optionally, the plurality of encapsulated islands and the plurality of bridges constitute a connected network; etching the etched flexible material layer to form the flexible base wall comprises etching the etched flexible material layer to form the substantially enclosed space extending throughout the connected network, the flexible base wall formed in a perimeter of the connected network; and the adhesive is filled in the substantially enclosed space extending throughout the connected network.

Optionally, subsequent to attaching the stretchable base substrate to the adhesive in the substantially enclosed space, the method further comprises removing the sacrificial layer, thereby separating the second rigid base substrate from the stretchable display panel.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
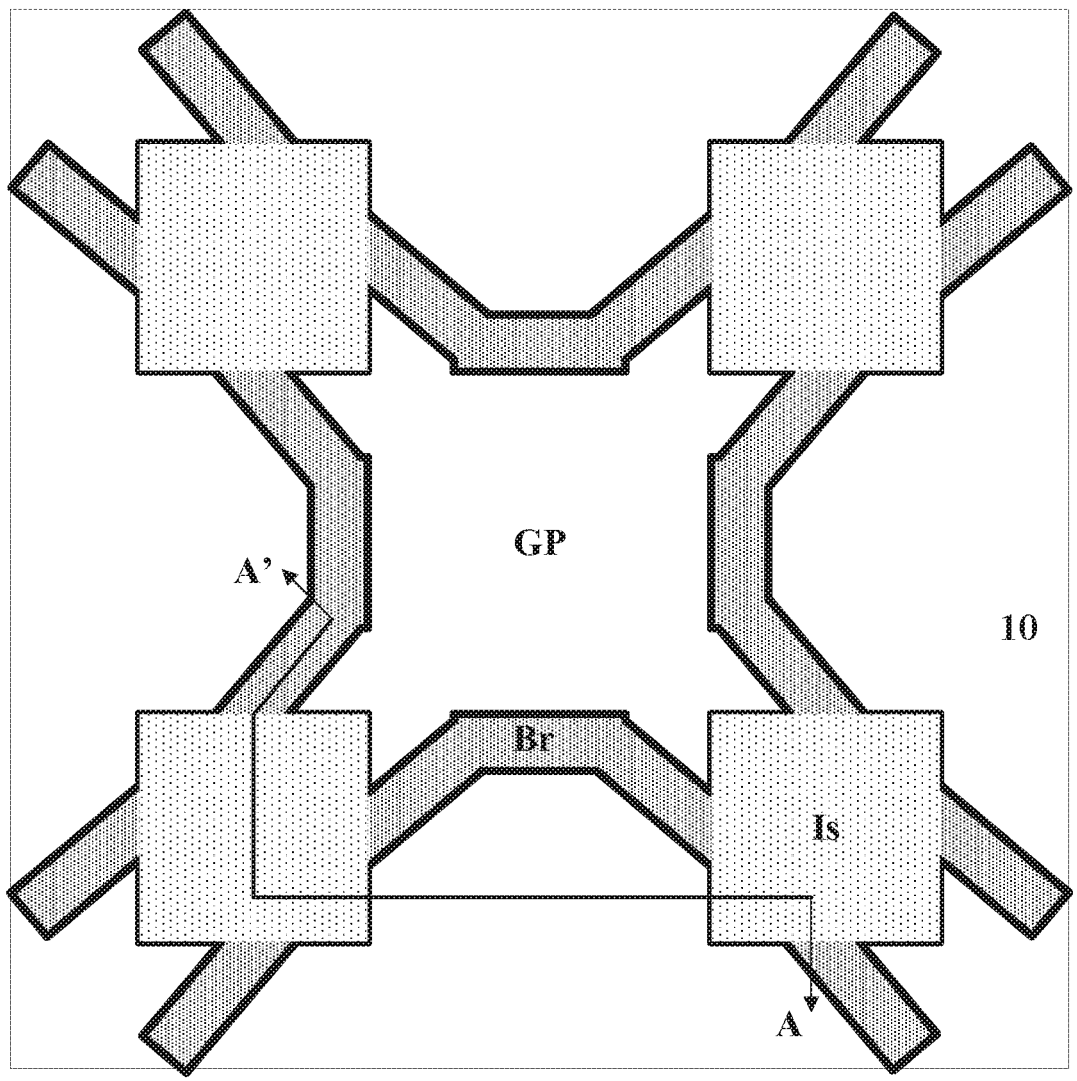
FIG. 1 is a plan view of a stretchable display panel in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In some embodiments of fabricating a stretchable display panel, the light emitting elements (e.g., organic light emitting diodes) are fabricated on a polyimide base substrate, the polyimide base substrate is etched to form gap regions between display islands and connecting bridges of the stretchable display panel, an adhesive is then applied on the etched polyimide base substrate for adhering a stretchable base substrate. It is discovered in the present disclosure that, during the process of adhering the stretchable base substrate, the adhesive often overflow into the gap regions, and at least partially occupying the gap regions. Due to the presence of the adhesive in the gap regions, the stretchability of the stretchable display panel can be adversely affected. In worse scenario, the stretchability can be reduced by at least 98% or more, Accordingly, the present disclosure provides, inter alia, a stretchable display panel, a stretchable display apparatus, and a method of fabricating a stretchable display panel that substantially obviate one or more of the problems due to limitations and disadvantages of the related art. In one aspect, the present disclosure provides a stretchable display panel having a plurality of encapsulated islands and a plurality of bridges connecting the plurality of encapsulated islands. In some embodiments, the stretchable display panel includes a stretchable base substrate; a flexible base wall on the stretchable base substrate, the flexible base wall substantially enclosing a substantially enclosed space; an adhesive layer on the stretchable base substrate and substantially enclosed in the substantially enclosed space; and a plurality of light emitting elements on a side of the adhesive layer away from the stretchable base substrate. Optionally, a respective one of the plurality of encapsulated islands comprises at least one of the plurality of light emitting elements encapsulated therein on the stretchable base substrate.

Various appropriate light emitting elements may be used in the present stretchable display panel. Examples of appropriate light emitting elements include an organic light emitting diode, a quantum dots light emitting diode, and a micro light emitting diode.

As used herein, the term "stretchable" refers to the ability of a material, structure, device or device component to be strained in tension (e.g., being made longer and/or wider) without undergoing permanent deformation or failure such as fracture, e.g., the ability to elongate at least 10% of its length without permanently deforming, tearing, or breaking. The term is also meant to encompass substrates having components (whether or not the components themselves are individually stretchable as stated above) that are configured in such a way so as to accommodate a stretchable, inflatable, or expandable surface and remain functional when applied to a stretchable, inflatable, or otherwise expandable surface that is stretched, inflated, or otherwise expanded respectively. The term is also meant to encompass substrates that may be elastically and/or plastically deformable (i.e. after being stretched, the substrate may return to its original size when the stretching force is released or the substrate may not return to its original size and in some examples, may remain in the stretched form) and the deformation (i.e. stretching and optionally flexing) may occur during manufacture of the substrate (e.g. with the substrate being stretched and optionally flexed to form its final shape), during assembly of a device incorporating the substrate (which may be considered part of the manufacturing operation) and/or during use (e.g. with the user being able to stretch and optionally flex the substrate).

As used herein, the term "substantially enclosing" or "substantially enclosed" refers to one object or structure being disposed about a circumference of another object or a space. The term "substantially enclosing" or "substantially enclosed" does not require complete enclosure, but may also include an entire or a partial enclosure. Optionally, "substantially enclosing" or "substantially enclosed" means completely enclosing or completely enclosed. As used herein, the term "substantially enclosed space" refers to a space having one object or structure being disposed about a circumference of the space. The term "substantially enclosed space" does not require the space being completely enclosed, but may also include entirely or partially enclosed. Optionally, "substantially enclosed space" means a completely enclosed space.

Figure 2:
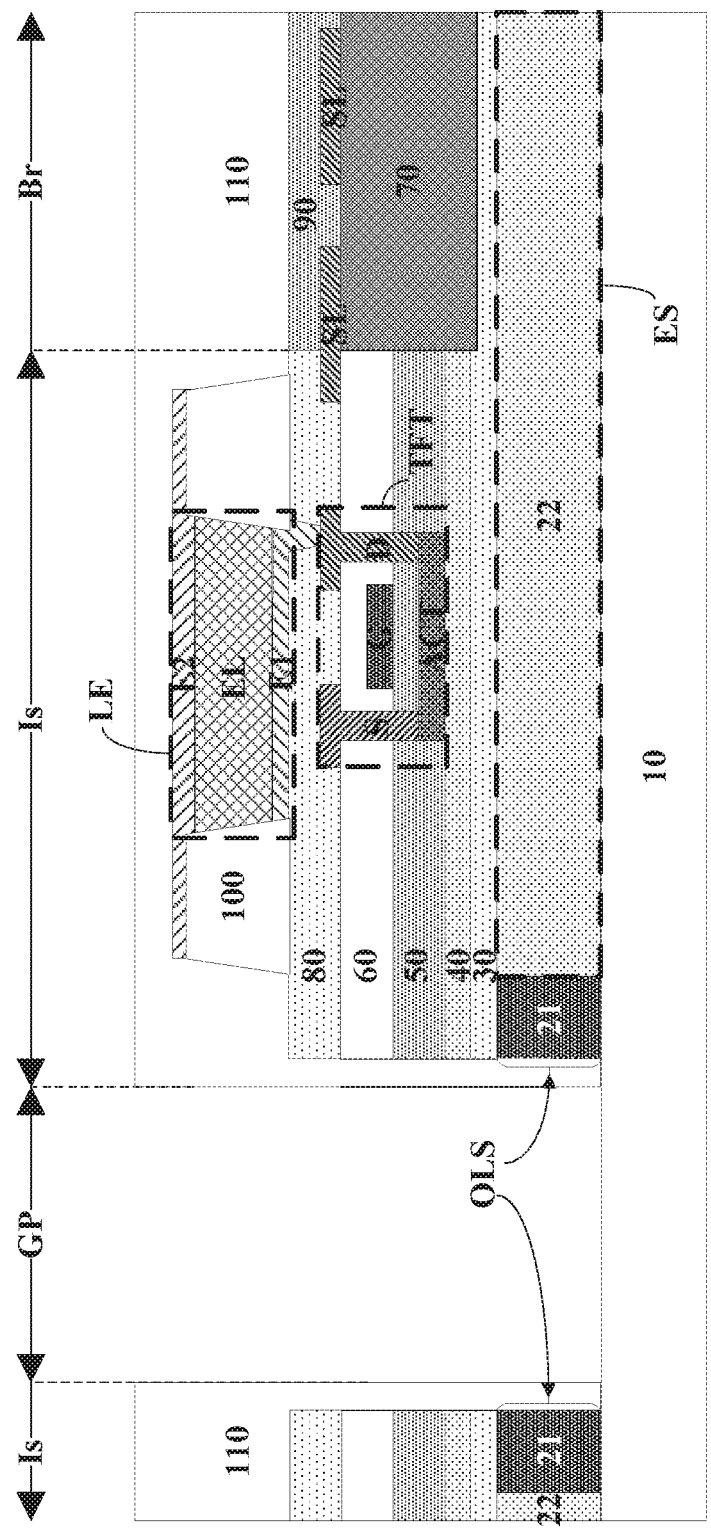
FIG. 2 is a cross-sectional view along an A-A' line of a stretchable display panel in FIG. 1.

FIG. 1 is a plan view of a stretchable display panel in some embodiments according to the present disclosure. Referring to FIG. 1, the stretchable display panel in some embodiments includes a plurality of encapsulated islands Is and a plurality of bridges Br connecting the plurality of encapsulated islands Is. FIG. 2 is a cross-sectional view along an A-A' line of a stretchable display panel in FIG. 1. Referring to FIG. 1 and FIG. 2, the stretchable display panel in some embodiments includes a stretchable base substrate 10; a flexible base wall 21 on the stretchable base substrate 10, the flexible base wall 21 substantially enclosing a substantially enclosed space ES; an adhesive layer 22 on the stretchable base substrate 10 and substantially enclosed in the substantially enclosed space ES; and a plurality of light emitting elements LE on a side of the adhesive layer 22 away from the stretchable base substrate 10.

Optionally, a respective one of the plurality of encapsulated islands Is includes at least one of the plurality of light emitting elements LE encapsulated therein on the stretchable base substrate 10. Optionally, the stretchable display panel in the respective one of the plurality of encapsulated islands Is includes a single one light emitting element of the plurality of light emitting elements LE. Optionally, the stretchable display panel in the respective one of the plurality of encapsulated islands Is includes multiple light emitting elements of the plurality of light emitting elements LE. Optionally, the respective one of the plurality of encapsulated islands Is includes a red light emitting element, a green light emitting element, and a blue light emitting element of the plurality of light emitting elements LE.

Figure 3:
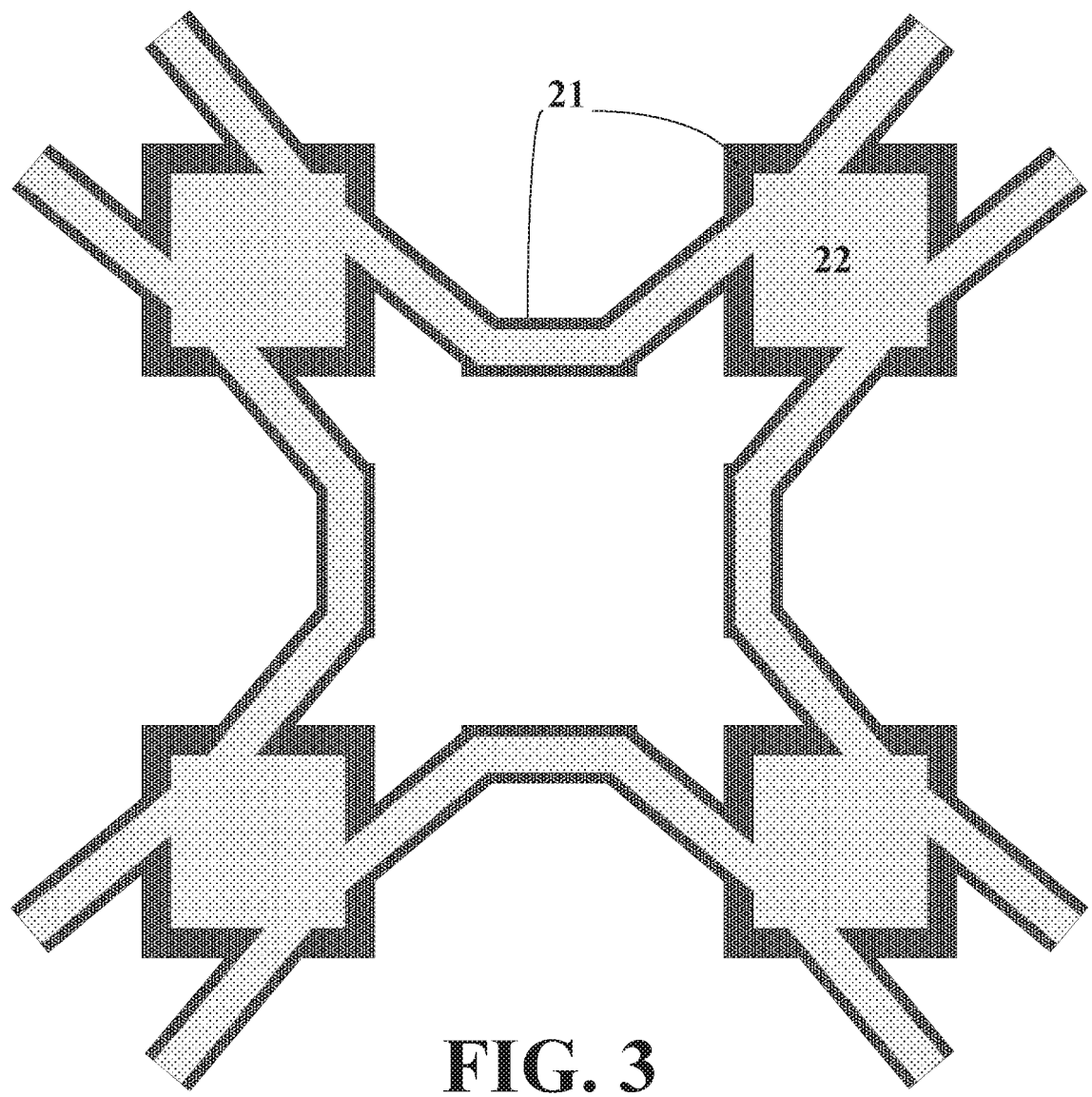
FIG. 3 is a plan view of a flexible base wall and an adhesive layer in some embodiments according to the present disclosure.

FIG. 3 is a plan view of a flexible base wall and an adhesive layer in some embodiments according to the present disclosure. Referring to FIG. 1 and FIG. 3, in some embodiments, the plurality of encapsulated islands Is and the plurality of bridges Br constitute a connected network. The flexible base wall 21 is in a perimeter of the connected network, forming the substantially enclosed space extending throughout the connected network. The adhesive layer 22 is in the substantially enclosed space extending throughout the connected network. In some embodiments, the stretchable display panel has a plurality of gaps GP respectively between adjacent encapsulated islands of the plurality of encapsulated islands Is. For example, as shown in FIG. 1, a boundary of a respective one of the plurality of gaps GP is formed by four adjacent encapsulated islands of the plurality of encapsulated islands Is as well as four adjacent bridges of the plurality of bridges Br. The flexible base wall 21 and the adhesive layer 22 are absent in the plurality of gaps GP. A respective one of the plurality of gaps GP is surrounded by a portion of the flexible base wall 21.

In the present stretchable display panel, the adhesive layer 22 is limited in regions corresponding to the plurality of encapsulated islands Is and the plurality of bridges Br, and is absent in the plurality of gaps GP. By having the flexible base wall 21, the adhesive layer 22 is substantially enclosed in the substantially enclosed space ES when the stretchable base substrate 10 is adhered to the adhesive layer 22. As a result, the adhesive layer 22 does not overflow into the plurality of gaps GP, significantly enhancing the stretchability of the stretchable display panel.

Referring to FIG. 2, the stretchable display panel in some embodiments further includes an encapsulating layer 110 encapsulating the plurality of encapsulated islands Is and the plurality of bridges Br. In some embodiments, the encapsulating layer 110 includes one or more inorganic sub-layers and one or more organic flexible sub-layers. Various appropriate organic materials may be used for making the one or more organic flexible sub-layers. Examples of appropriate organic materials for making the one or more organic flexible sub-layers include polyimides, polysilicones, polysiloxanes, polyepoxides, silicone-based polymers (e.g., polydimethylsiloxane-based materials such as polydimethylsiloxane, hexamethyldisiloxane, and polyphenylmethylsiloxane), polyurethane-based materials (such as polyurethane, polyurethane acrylate, polyether urethane, and polycarbonate-polyurethane elastomers), polyvinylfluoride, polyvinylchloride, acrylate polymer, acrylate terpolymer, rubbers (e.g., chloroprene rubber, acryl-based rubber, and nitrile rubber), polyvinylpyrrolidone, polyvinyl alcohol, polymethyl methacrylate, cellulose acetate. cellulose acetate butyrate, cellulose acetate propionate, polymethyl acrylate, polyvinyl acetate, polyacrylonitrile, polyfurfuryl alcohol, polystyrene, polyethylene oxide, polypropylene oxide, polycarbonate, polyvinyl chloride, polycaprolactone, and any combination thereof. Various appropriate inorganic materials may be used for making the one or more inorganic sub-layers. Examples of appropriate inorganic materials for making the one or more inorganic sub-layers include silicon oxide, silicon nitride, silicon oxynitride, or any combination thereof.

In some embodiments, the encapsulating layer 110 substantially covers an outer lateral side OLS of the flexible base wall 21. As used herein, the term "substantially covers" refers to an orthographic projection of an object being at least 50%, at least 60%, at least 70%, at least 80%, at least 90%, at least 95%, at least 99%, or 100% covered by an orthographic projection of another object. In one example, at least one of the inorganic sub-layers of the encapsulating layer 110 substantially covers an outer lateral side OLS of the flexible base wall 21. In another example, the encapsulating layer 110 includes a first inorganic sub-layer and a second inorganic sub-layer, both of which substantially covers an outer lateral side OLS of the flexible base wall 21. Optionally, the at least one of the inorganic sub-layers of the encapsulating layer 110 completely covers an outer lateral side OLS of the flexible base wall 21. Optionally, the at least one of the inorganic sub-layers of the encapsulating layer 110 partially covers an outer lateral side OLS of the flexible base wall 21.

Optionally, each of the flexible base wall 21 and the adhesive layer 22 is in direct contact with the stretchable base substrate 10. Optionally, the flexible base wall 21 and the adhesive layer 22 are in direct contact with a same surface of the stretchable base substrate 10. Optionally, the flexible base wall 21 and the adhesive layer 22 have a substantially same thickness. As used herein, the term "substantially the same" refers to a difference between two values not exceeding 10% of a base value (e.g., one of the two values). e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value.

In some embodiments, the encapsulating layer 110 substantially covers the plurality of bridges Br. In one example, at least one of the inorganic sub-layers of the encapsulating layer 110 extends into the plurality of bridges Br. In another example, the encapsulating layer 110 includes a first inorganic sub-layer and a second inorganic sub-layer, both of which extends into the plurality of bridges Br. Optionally, at least one of the inorganic sub-layers of the encapsulating layer 110 has a reduced thickness in the plurality of bridges Br as compared to in the plurality of encapsulated islands Is.

Optionally, the stretchable base substrate 10 extends throughout an entirety of the stretchable display panel. Optionally, the stretchable base substrate 10 is limited in the connected network, e.g., limited in the plurality of encapsulated islands Is and the plurality of bridges Br. Optionally, the stretchable base substrate 10 is absent in the plurality of gaps GP.

Figure 4:
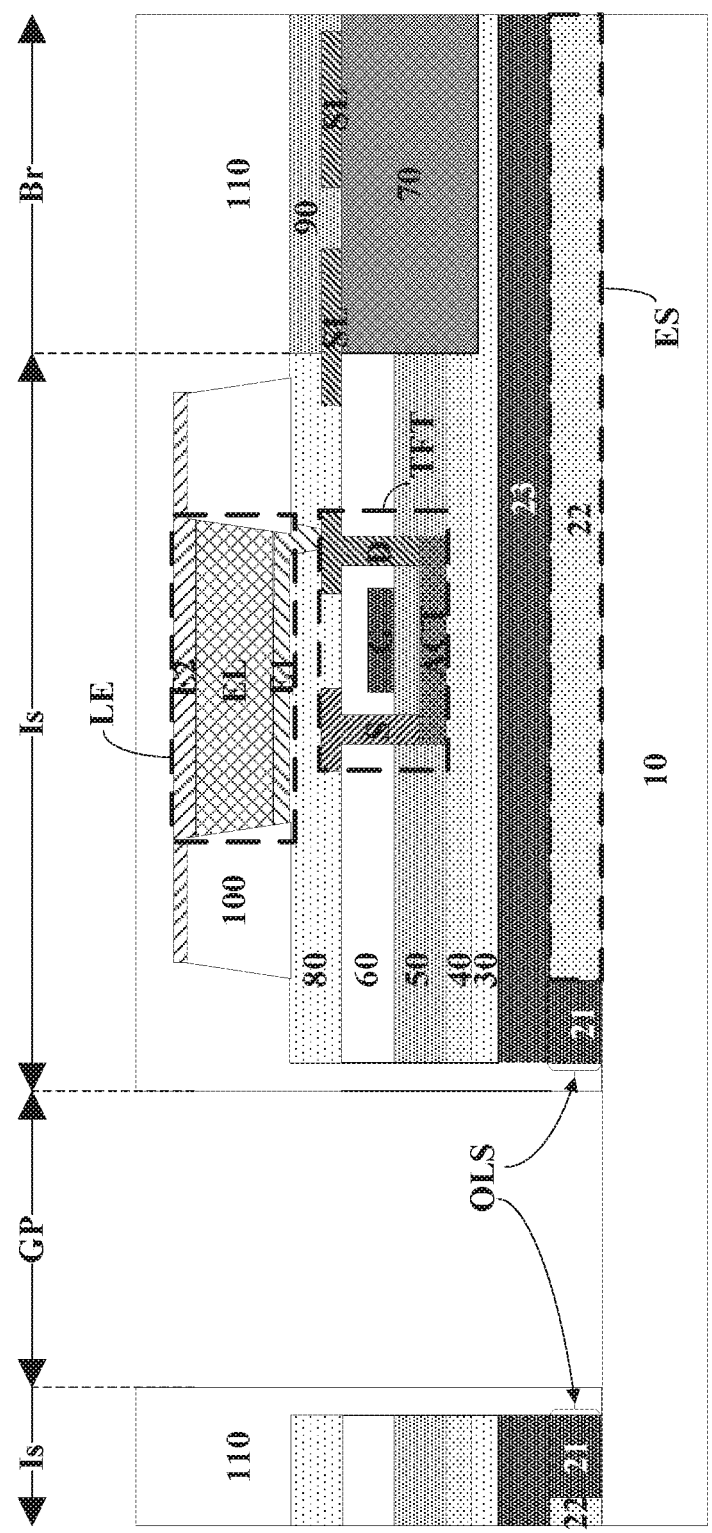
FIG. 4 is a cross-sectional view of a stretchable display panel in some embodiments according to the present disclosure.

FIG. 4 is a cross-sectional view of a stretchable display panel in some embodiments according to the present disclosure. Referring to FIG. 4, the stretchable display panel in some embodiments further includes a flexible base pattern 23 on a side of the adhesive layer 22 away from the stretchable base substrate 10. The flexible base wall 21, the flexible base pattern 23, and the stretchable base substrate 10 substantially enclose the adhesive layer 22 in the substantially enclosed space ES. Optionally, the flexible base pattern 23 and the flexible base wall 21 constitute a unitary structure and are made of a same material, e.g., in a same patterning process using a same mask plate. Optionally, the flexible base pattern 23 and the flexible base wall 21 are separately fabricated. Optionally, each of the flexible base wall 21 and the adhesive layer 22 is in direct contact with the stretchable base substrate 10. Optionally, the flexible base wall 21 and the adhesive layer 22 are in direct contact with a same surface of the stretchable base substrate 10. Optionally, the flexible base wall 21 and the adhesive layer 22 have a substantially same thickness. Optionally, the flexible base pattern 23 is spaced apart from the stretchable base substrate 10 by the adhesive layer 22.

Referring to FIG. 2 and FIG. 4, in some embodiments, the stretchable display panel further includes a plurality of driving circuits for driving light emission of the plurality of light emitting elements LE. The plurality of driving circuits includes a plurality of thin film transistors TFT respectively in the plurality of encapsulated islands Is and a plurality of signal lines SL in the plurality of bridges Br. A respective one of the plurality of thin film transistors TFT includes an active layer ACT, a gate insulating layer 50 on the active layer ACT, a gate electrode G on a side of the gate insulating layer 50 away from the active layer ACT, an inter-layer dielectric layer 60 on a side of the gate electrode G away from the gate insulating layer 50, a source electrode S and a drain electrode D on a side of the inter-layer dielectric layer 60 away from the gate insulating layer 50.

A respective one of the plurality of light emitting elements LE in some embodiments includes a first electrode E1, a light emitting layer EL, and a second electrode E2. The first electrode E1 extends through a first planarization layer 80 to electrically connected to the drain electrode D of a respective one of the plurality of thin film transistors TFT. Optionally, the stretchable display panel further includes a pixel definition layer 100 for defining a plurality of subpixel apertures, a respective one of which receiving the light emitting layer EL.

In some embodiments, the stretchable display panel in the plurality of encapsulated islands Is includes a barrier layer 30 on a side of the flexible base wall 21 and the adhesive layer 22 away from the stretchable base substrate 10. Optionally, the barrier layer 30 extends from the plurality of encapsulated islands Is into the plurality of bridges Br, e.g., the barrier layer 30 extends throughout the connected network. Optionally, the barrier layer 30 is in direct contact with the adhesive layer 22 and the flexible base wall 21. Optionally, the barrier layer 30 is in direct contact with the flexible base pattern 23, and is spaced apart from the adhesive layer 22 by the flexible base pattern 23.

In some embodiments, the encapsulating layer 110 substantially covers an outer lateral side of a respective one of the plurality of encapsulated islands Is. Optionally, the encapsulating layer 110 completely covers at least an outer lateral side of the barrier layer 30 in the respective one of the plurality of encapsulated islands Is, thereby encapsulating the respective one of the plurality of light emitting elements LE in the respective one of the plurality of encapsulated islands Is.

In some embodiments, the stretchable display panel in the plurality of encapsulated islands Is further includes a buffer layer 40 on a side of the barrier layer 30 away from the stretchable base substrate 10. Optionally, the plurality of thin film transistors TFT are on a side of the buffer layer 40 away from the stretchable base substrate 10.

In some embodiments, the stretchable display panel in the plurality of bridge Br includes a second planarization layer 70 on a side of the adhesive layer 22 away from the stretchable base substrate 10. Optionally, the second planarization layer 70 is made of a polymer material such as a resin material.

In some embodiments, the stretchable display panel in the plurality of bridge Br further includes a plurality of signal lines SL on a side of the second planarization layer 70 away from the stretchable base substrate 10, and a third planarization layer 90 on a side of the plurality of signal lines SL away from the second planarization layer 70. The encapsulating layer 110 is on a side of the third planarization layer 90 away from the second planarization layer 70. The plurality of signal lines SL are configured to transmit signals into or out from a respective one of the plurality of encapsulated islands Is. Examples of the plurality of signal lines SL include gate lines, data lines, common electrode signal lines, power signal lines, clock signal lines, and so on. Optionally, the plurality of signal lines SL are a plurality of flexible signal lines.

Various appropriate materials may be used for making the plurality of signal lines SL. Examples of appropriate conductive materials for making the plurality of signal lines SL include metals, alloys, graphene, carbon nanotubes, flexible conductive polymers, and other flexible conductive materials. For example, in some embodiments, the plurality of signal lines SL are made of one or a combination of a liquid metal, carbon nanotubes, graphene, and silver nanowires.

Various appropriate elastomer polymer materials may be used for making the stretchable base substrate 10, the flexible base wall 21, and the flexible base pattern 23. Examples of appropriate elastomer polymers include polyimides, polysilicones, polysiloxanes, polyepoxides, silicone-based polymers (e.g., polydimethylsiloxane-based materials such as polydimethylsiloxane, hexamethyldisiloxane, and polyphenylmethylsiloxane), polyurethane-based materials (such as polyurethane, polyurethane acrylate, polyether urethane, and polycarbonate-polyurethane elastomers), polyvinylfluoride, polyvinylchloride, acrylate polymer, acrylate terpolymer, rubbers (e.g., chloroprene rubber, acryl-based rubber, and nitrile rubber), polyvinylpyrrolidone, polyvinyl alcohol, polymethyl methacrylate, cellulose acetate, cellulose acetate butyrate, cellulose acetate propionate, polymethyl acrylate, polyvinyl acetate, polyacrylonitrile, polyfurfuryl alcohol, polystyrene, polyethylene oxide, polypropylene oxide, polycarbonate, polyvinyl chloride, polycaprolactone, and any combination thereof.

Various appropriate insulating materials and various appropriate fabricating methods may be used for making the barrier layer 30. For example, an insulating material may be deposited on the substrate by a plasma-enhanced chemical vapor deposition (PECVD) process and patterned. Examples of appropriate insulating materials for making the barrier layer 30 include, but are not limited to, silicon oxide ($SiO_x$), silicon nitride ($SiN_y$, e.g., $Si_3N_4$), silicon oxynitride ($SiO_xN_y$). Optionally, the barrier layer 30 are made of an inorganic material.

Various appropriate insulating materials and various appropriate fabricating methods may be used to make the buffer layer 40, the gate insulating layer 50, the inter-layer dielectric layer 60, the first planarization layer 80, the second planarization layer 70, the third planarization layer 90, and the pixel definition layer 100. For example, an insulating material may be deposited on the substrate by a plasma-enhanced chemical vapor deposition (PECVD) process and patterned. Examples of appropriate insulating materials for making the buffer layer 40, the gate insulating layer 50, the inter-layer dielectric layer 60, the first planarization layer 80, and the pixel definition layer 100, include, but are not limited to, silicon oxide ($SiO_x$), silicon nitride ($SiN_y$, e.g., $Si_3N_4$), silicon oxynitride ($SiO_xN_y$), various resins, and various organic polymers.

In another aspect, the present disclosure provides a method of fabricating a stretchable display panel having a plurality of encapsulated islands and a plurality of bridges connecting the plurality of encapsulated islands. In some embodiments, the method includes forming a flexible base wall on a stretchable base substrate, the flexible base wall formed to substantially enclose a substantially enclosed space; forming an adhesive layer on the stretchable base substrate, the adhesive layer formed to be substantially enclosed in the substantially enclosed space; and forming a plurality of light emitting elements, the plurality of light emitting elements formed on a side of the adhesive layer away from the stretchable base substrate. Optionally, a respective one of the plurality of encapsulated islands is formed to comprise at least one of the plurality of light emitting elements encapsulated therein on the stretchable base substrate.

In some embodiments, the plurality of encapsulated islands and the plurality of bridges are formed to constitute a connected network. Optionally, the flexible base wall is formed in a perimeter of the connected network, forming the substantially enclosed space extending throughout the connected network; and the adhesive layer is formed in the substantially enclosed space extending throughout the connected network.

In some embodiments, the method further includes forming a plurality of gaps respectively between adjacent encapsulated islands of the plurality of encapsulated islands. Optionally, the adhesive layer is absent in the plurality of gaps; and a respective one of the plurality of gaps is formed to be surrounded by a portion of the flexible base wall. Optionally, prior to forming the flexible base wall, the method further includes forming a flexible material layer on a first rigid base substrate; forming the plurality of light emitting elements on the flexible material layer, the plurality of light emitting elements formed in regions corresponding to the plurality of encapsulated islands, thereby forming an intermediate substrate comprising the plurality of light emitting elements; and etching through a plurality of layers of the intermediate substrate including the flexible material layer in regions between the adjacent encapsulated islands of the plurality of encapsulated islands, thereby forming a plurality of gap regions corresponding to the plurality of gaps.

In some embodiments, subsequent to etching through the plurality of layers of the intermediate substrate, the method further includes forming an encapsulating layer encapsulating the plurality of encapsulated islands and the plurality of bridges. Optionally, the flexible material layer is etched to form an etched flexible material layer during etching through the plurality of layers of the intermediate substrate; and the encapsulating layer is formed to substantially cover an outer lateral side of the etched flexible material layer.

In some embodiments, subsequent to forming the encapsulating layer, the method further includes forming a sacrificial layer on a side of the encapsulating layer away from the first rigid base substrate; and adhering a side of the sacrificial layer away from the first rigid base substrate to a second rigid base substrate. Optionally, the flexible material layer is etched to form an etched flexible material layer during etching the intermediate substrate; and the etched flexible material layer substantially covers regions corresponding to the plurality of encapsulated islands and the plurality of bridges. Optionally, subsequent to adhering the side of the sacrificial layer away from the first rigid base substrate to the second rigid base substrate, the method further includes separating the etched flexible material layer from the first rigid base substrate, thereby exposing a surface of the etched flexible material layer; and subsequent to exposing the surface of the etched flexible material layer, etching the etched flexible material layer to form a flexible base wall substantially enclosing a substantially enclosed space. Optionally, forming the adhesive layer includes filling an adhesive in the substantially enclosed space; and attaching the stretchable base substrate to the adhesive in the substantially enclosed space.

In some embodiments, the etched flexible material layer is etched incompletely through a thickness of the etched flexible material layer, thereby forming the flexible base wall and a flexible base pattern enclosing the substantially enclosed space. Optionally, the flexible base pattern is formed on a side of the adhesive layer away from the stretchable base substrate, the flexible base wall, the flexible base pattern, and the stretchable base substrate substantially enclosing the adhesive layer in the substantially enclosed space.

In some embodiments, the plurality of encapsulated islands and the plurality of bridges constitute a connected network. Optionally, etching the etched flexible material layer to form the flexible base wall includes etching the etched flexible material layer to form the substantially enclosed space extending throughout the connected network, the flexible base wall formed in a perimeter of the connected network. Optionally, the adhesive is filled in the substantially enclosed space extending throughout the connected network.

In some embodiments, subsequent to attaching the stretchable base substrate to the adhesive in the substantially enclosed space, the method further includes removing the sacrificial layer, thereby separating the second rigid base substrate from the stretchable display panel.

Figure 5A:
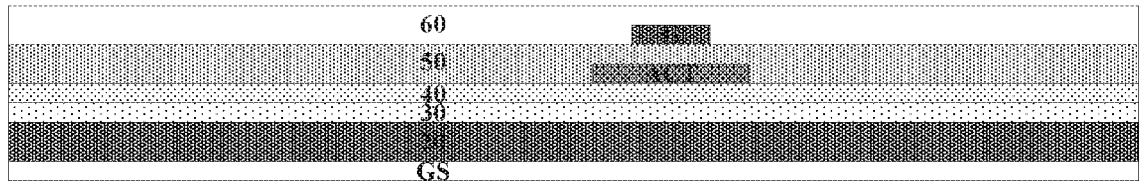
FIGS. 5A to 5K illustrate a method of fabricating a stretchable display panel in some embodiments according to the present disclosure.

FIGS. 5A to 5K illustrate a method of fabricating a stretchable display panel in some embodiments according to the present disclosure. Referring to FIG. 5A, a flexible material layer 20 is formed on a first rigid base substrate GS (e.g., a glass substrate), a barrier layer 30 is formed on a side of the flexible material layer 20 away from the first rigid base substrate GS, a buffer layer 40 is formed on a side of the barrier layer 30 away from the first rigid base substrate GS, an active layer ACT is formed on a side of the buffer layer 40 away from the first rigid base substrate GS, a gate insulating layer 50 is formed on a side of the active layer ACT away from the first rigid base substrate GS, a gate electrode G is formed on a side of the gate insulating layer 50 away from the first rigid base substrate GS, and an inter-layer dielectric layer 60 is formed on a side of the gate electrode G away from the first rigid base substrate GS.

Figure 5B:
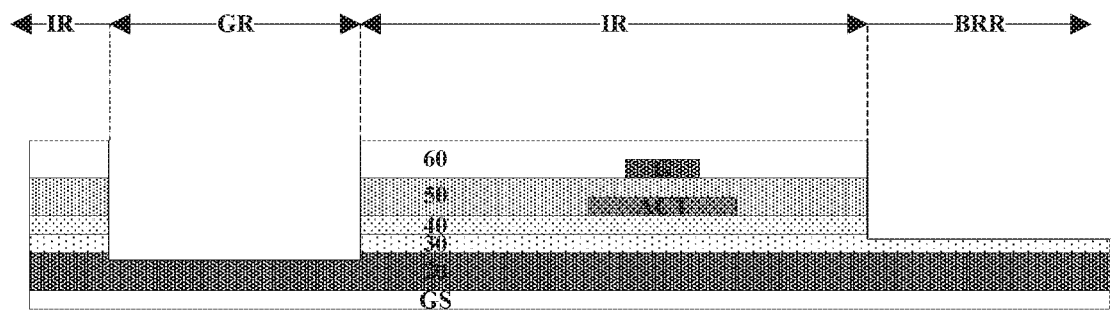

Referring to FIG. 5B, the substrate formed in FIG. 5A is etched to form a plurality of gap regions GR corresponding to the plurality of gaps in the stretchable display panel, and a plurality of bridge regions BRR corresponding to the plurality of bridges in the stretchable display panel. The remaining, un-etched regions are a plurality of island regions IR corresponding to the plurality of encapsulated islands in the stretchable display panel. Optionally, in the plurality of gap regions GR, the substrate is etched to expose a surface of the flexible material layer 20. Optionally, in the plurality of bridge regions BRR, the substrate is etched to expose a surface of the barrier layer 30. Having the barrier layer 30 intact or at least partially preserved in the plurality of bridge regions BRR, the plurality of signal lines (to be formed in the plurality of bridge regions BRR) can be fully encapsulated. For example, the barrier layer 30 in the plurality of bridge regions BRR can prevent moist or oxygen from permeating into the plurality of bridge regions BRR to corrode the plurality of signal lines.

Figure 5C:
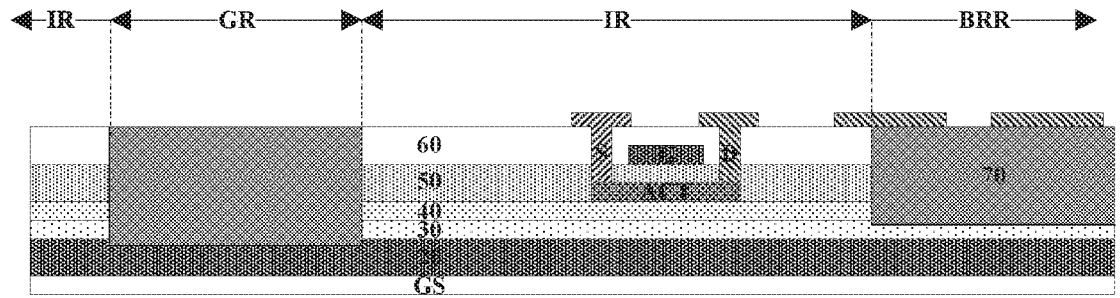

Referring to FIG. 5C, subsequent to forming the plurality of gap regions GR and the plurality of bridge regions BRR the plurality of gap regions GR and the plurality of bridge regions BRR are filled with a planarization material, thereby forming a second planarization layer 70. In one example, the second planarization layer 70 is formed using a polymer material such as a resin. By having the second planarization layer 70 in the plurality of gap regions GR and the plurality of bridge regions BRR, subsequent components and structures can be formed in a relatively planarized surface, obviating line broken due to large segmental difference in the plurality of gap regions GR and the plurality of bridge regions BRR.

In the plurality of island regions IR a source electrode S and a drain electrode D are formed to respectively extend through the inter-layer dielectric layer 60 and the gate insulating layer 50 to respectively electrically connected to the active layer ACT. In the plurality of bridge regions BRR a plurality of signal lines SL are formed on a side of the second planarization layer 70 away from the first rigid base substrate GS. Optionally, the source electrode S, the drain electrode D, and the plurality of signal lines SL are formed in a same layer, in a same patterning process, using a same mask plate and a same material. As used herein, the term "same layer" refers to the relationship between the layers simultaneously formed in the same step. In one example, the source electrode S, the drain electrode D, and the plurality of signal lines SL are in a same layer when they are formed as a result of one or more steps of a same patterning process performed in a same layer of material. In another example, the source electrode S, the drain electrode D. and the plurality of signal lines SL can be formed in a same layer by simultaneously performing the step of forming the plurality of signal lines SL and the step of forming the source electrode S and the drain electrode D. The term "same layer" does not always mean that the thickness of the layer or the height of the layer in a cross-sectional view is the same.

Figure 5D:
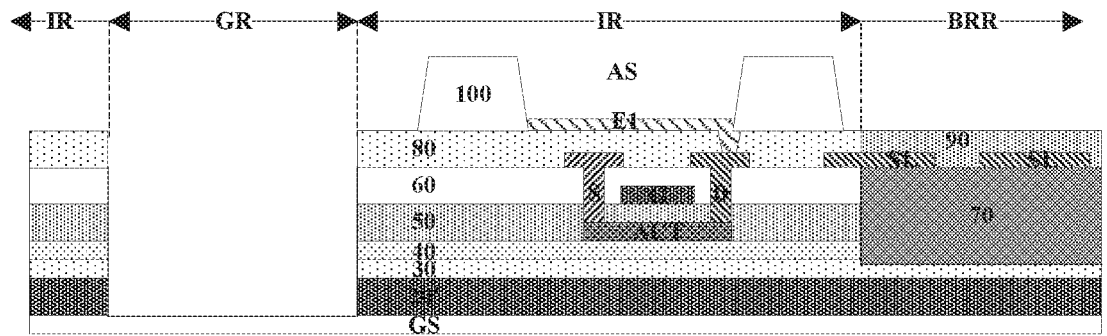

Referring to FIG. 5D, in the plurality of island regions IR, a first planarization layer 80 is formed on a side of the source electrode S and the drain electrode D away from the first rigid base substrate GS, a first electrode E1 is formed on a side of the first planarization layer 80 away from the first rigid base substrate GS, and a pixel definition layer 100 is formed on a side of the first planarization layer 80 away from the first rigid base substrate GS. The pixel definition layer 100 is formed to define a plurality of subpixel apertures AS.

In the plurality of gap regions GR, the second planarization layer 70 and the flexible material layer 20 are substantially removed, to expose a surface of the first rigid base substrate GS. Etching the flexible material layer 20 in the plurality of gap regions GR results in an etched flexible material layer 20'. The etched flexible material layer 20' substantially covers the plurality of island regions IR and the plurality of bridge regions BRR.

In the plurality of bridge regions BRR, a third planarization layer 90 is formed on a side of the plurality of signal lines SL away from the second planarization layer 70.

Figure 5E:
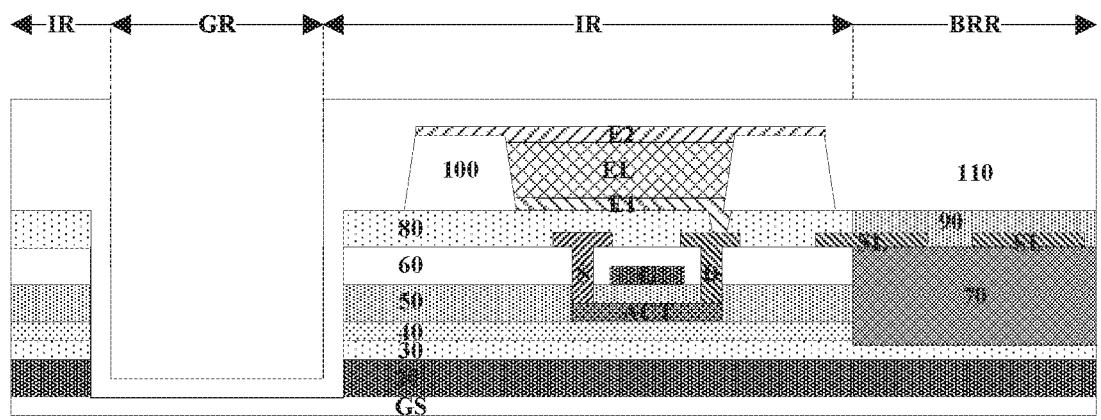

Referring to FIG. 5E, alight emitting layer EL is formed in the plurality of subpixel apertures, and a second electrode E2 is formed on a side of the light emitting layer EL away from the first electrode E1. An encapsulating layer 110 is formed to encapsulate the plurality of light emitting elements LE in the plurality of island regions IR and the plurality of signal lines SL in the plurality of bridge regions BRR. The encapsulating layer 110 is formed to extend into the regions corresponding to the plurality of gap regions GR, and to at least partially cover the exposed surface of the first rigid base substrate GS. The encapsulating layer 110 is formed to at least partially cover an outer lateral side of the etched flexible material layer 20' adjacent to the plurality of gap regions GR.

Figure 5F:
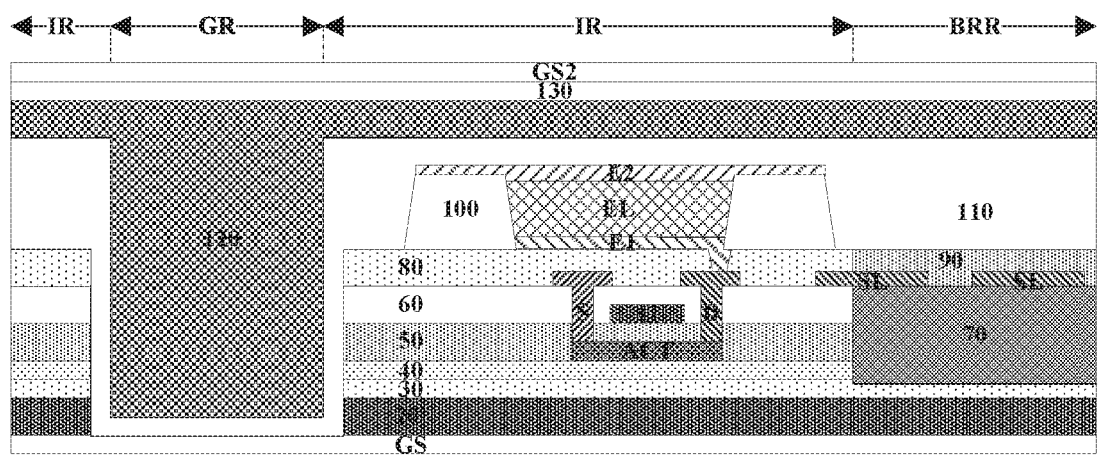

Referring to FIG. 5F, a sacrificial layer 120 is formed to fill in the plurality of gap regions GR, and on a side of the encapsulating layer 110 away from the first rigid base substrate GS. A second rigid base substrate GS2 is then attached to the sacrificial layer 120, e.g., through a second adhesive layer 130. For example, a side of the sacrificial layer 120 away from the first rigid base substrate GS is attached to a second rigid base substrate GS2.

Various appropriate sacrificial materials may be used for making the sacrificial layer. Examples of appropriate sacrificial materials include water-soluble materials such as water-soluble polymers. Examples of water-soluble polymers include water-soluble polyacrylate and water-soluble polyurethane. Examples of appropriate sacrificial materials further includes various metal materials that can be etched by an etchant (e.g., a wet etchant). Examples of appropriate sacrificial materials further includes materials suitable for lift-off (e.g., laser lift-off), such as silicon oxide and silicon nitride. In one example, the sacrificial layer 120 is made of photosensitive polyimide.

Figure 5G:
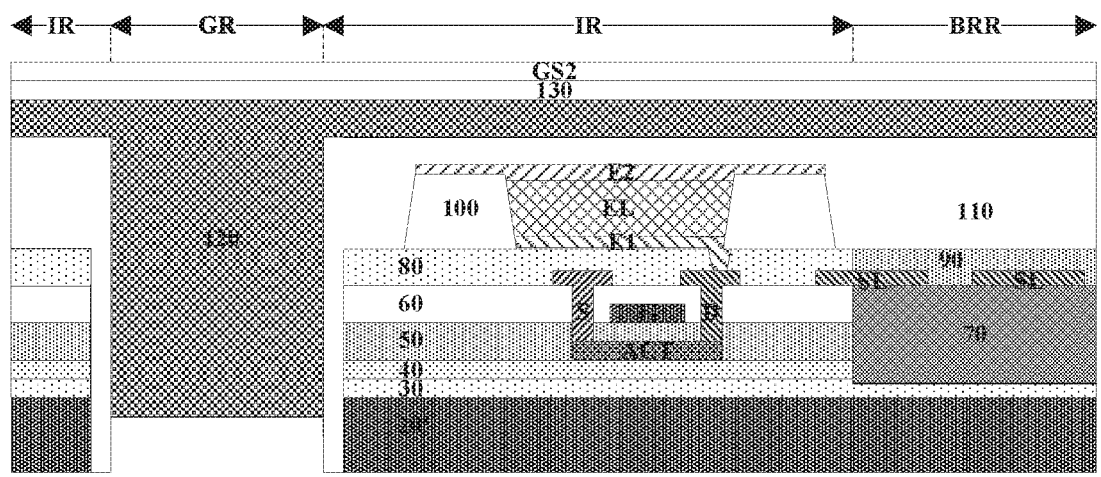

Referring to FIG. 5G, the first rigid base substrate GS is removed, e.g., separated from the etched flexible material layer 20' by laser lift-off. Separating the etched flexible material layer 20' from the first rigid base substrate GS exposes a surface of the etched flexible material layer 20'.

Figure 5H:
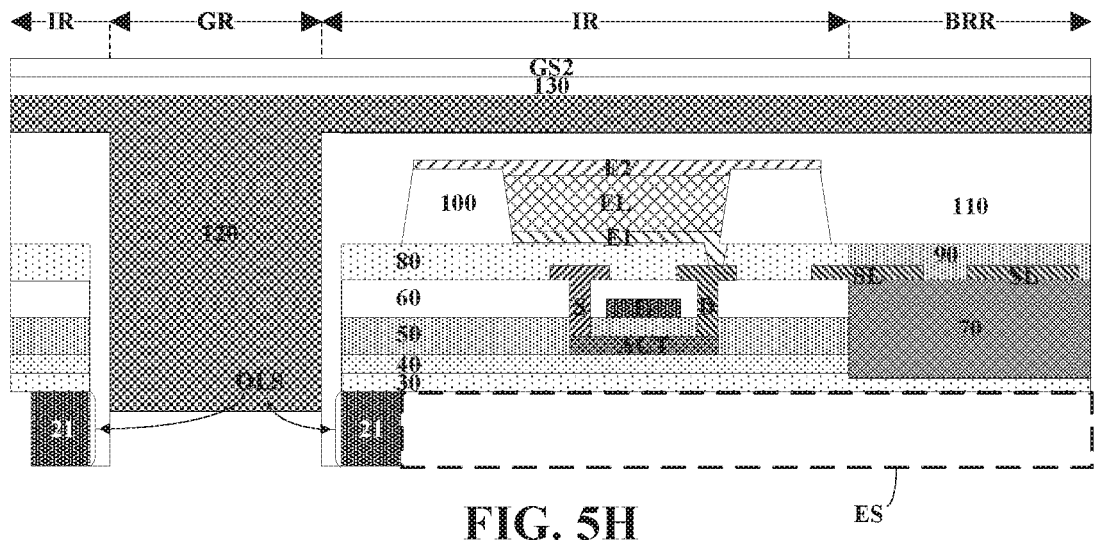

Referring to FIG. 5H, the etched flexible material layer 20' is etched to form a flexible base wall 21 to substantially enclose a substantially enclosed space ES. As shown in FIG. 5H, in some embodiments, the encapsulating layer 110 substantially covers an outer lateral side OLS of the flexible base wall 21. The plurality of island regions 1R and the plurality of bridge regions BRR constitute a connected network. Etching the etched flexible material layer 20' to form the flexible base wall 21 includes etching the etched flexible material layer 20' to form the substantially enclosed space ES extending throughout the connected network of the plurality of island regions 1R and the plurality of bridge regions BRR. The flexible base wall 21 is formed in a perimeter of the connected network.

Figure 5I:
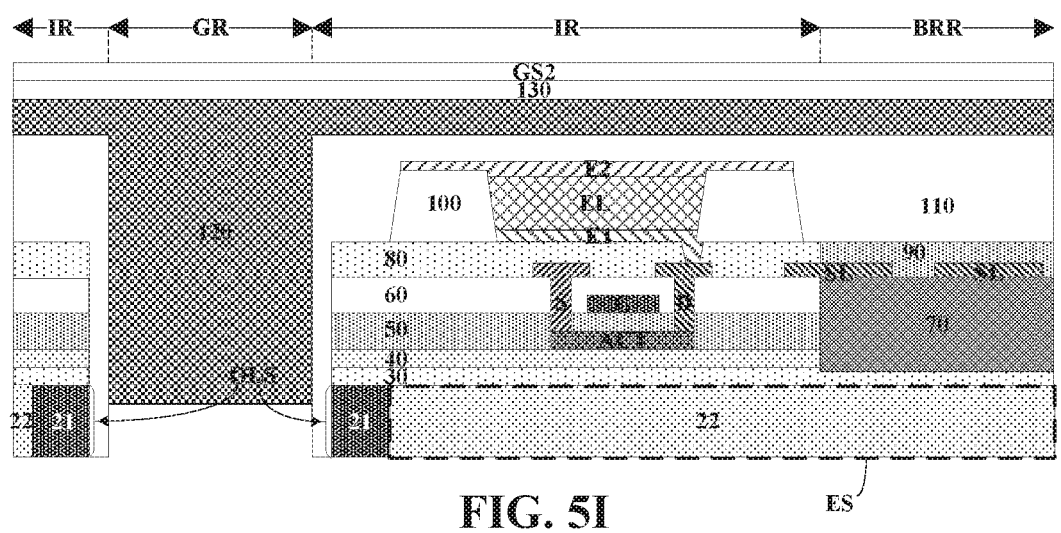

Referring to FIG. 5I, an adhesive layer 22 is formed in the substantially enclosed space ES extending throughout the connected network.

Figure 5J:
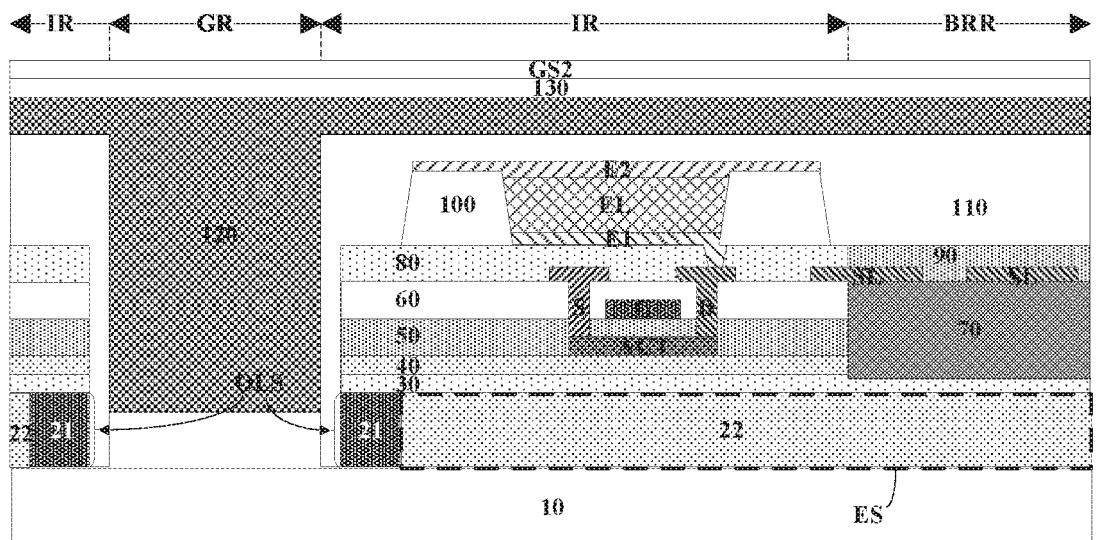

Referring to FIG. 5J, a stretchable base substrate 10 is then attached to the adhesive layer 22.

Figure 5K:
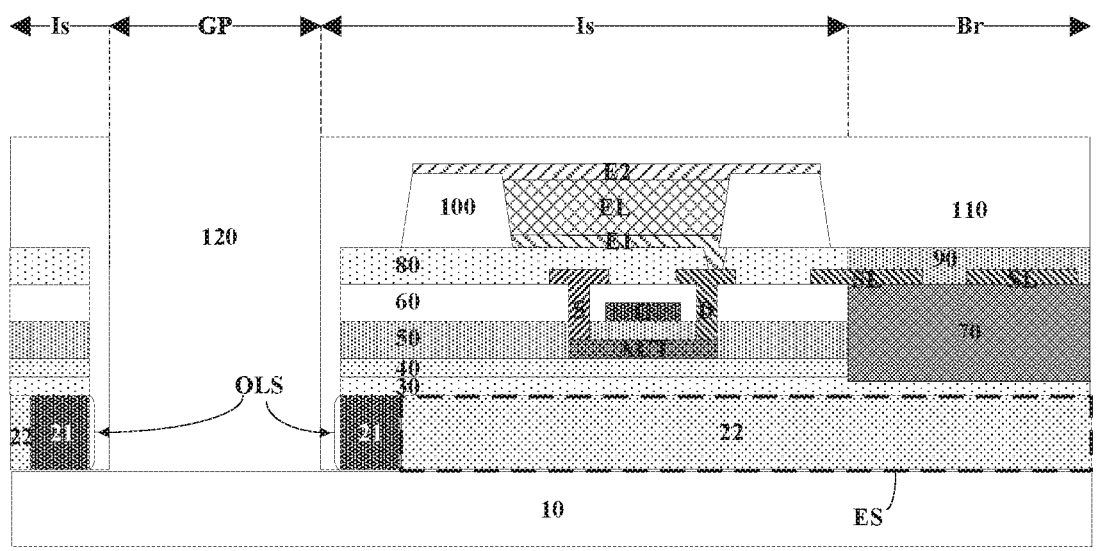

Referring to FIG. 5K, the sacrificial layer 120 is removed, thereby separating the second rigid base substrate GS2 from the stretchable display panel. A stretchable display panel is formed to have a plurality of encapsulated islands Is and a plurality of bridges Br connecting the plurality of encapsulated islands Is. A plurality of gaps GP are respectively between adjacent encapsulated islands of the plurality of encapsulated islands Is. In one example, the sacrificial layer 120 is made of photosensitive polyimide, and removal of the sacrificial layer 120 is performed by oxygen ion etching. Other appropriate removal methods such as heating and UV irradiation may also be used independently or in combination.

In another aspect, the present disclosure provides a stretchable display apparatus including the stretchable display panel described herein or fabricated by a method described herein, and one or more driving circuits for driving image display in the stretchable display panel. Examples of appropriate stretchable display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A stretchable display panel having a plurality of encapsulated islands and a plurality of bridges connecting the plurality of encapsulated islands, comprising:
   a stretchable base substrate;
   a flexible base wall on the stretchable base substrate, the flexible base wall substantially enclosing a substantially enclosed space;
   an adhesive layer on the stretchable base substrate and substantially enclosed in the substantially enclosed space;
   a plurality of light emitting elements on a side of the adhesive layer away from the stretchable base substrate; and
   an encapsulating layer encapsulating the plurality of encapsulated islands and the plurality of bridges;
   wherein a respective one of the plurality of encapsulated islands comprises at least one of the plurality of light emitting elements encapsulated therein on the stretchable base substrate;
   wherein the plurality of encapsulated islands and the plurality of bridges constitute a connected network;
   the flexible base wall is in a perimeter of the connected network, forming the substantially enclosed space extending throughout the connected network; and
   the adhesive layer is in the substantially enclosed space extending throughout the connected network;
   wherein the stretchable display panel has a plurality of gaps respectively between adjacent encapsulated islands of the plurality of encapsulated islands;
   the adhesive layer is absent in the plurality of gaps; and
   a respective one of the plurality of gaps is surrounded by a portion of the flexible base wall;
   wherein the encapsulating layer substantially covers an outer lateral side of the flexible base wall.

2. The stretchable display panel of claim 1, wherein the stretchable base substrate extends throughout an entirety of the stretchable display panel.

3. The stretchable display panel of claim 1, further comprising a flexible base pattern on a side of the adhesive layer away from the stretchable base substrate;
   wherein the flexible base wall, the flexible base pattern, and the stretchable base substrate substantially enclose the adhesive layer in the substantially enclosed space.

4. The stretchable display panel of claim 3, wherein the flexible base pattern and the flexible base wall constitute a unitary structure and comprise a same material.

5. A stretchable display apparatus, comprising the stretchable display panel of claim 1, and one or more integrated circuits connected to the stretchable display panel.

6. A method of fabricating a stretchable display panel having a plurality of encapsulated islands and a plurality of bridges connecting the plurality of encapsulated islands, comprising:
   forming a flexible base wall on a stretchable base substrate, the flexible base wall formed to substantially enclose a substantially enclosed space;
   forming an adhesive layer on the stretchable base substrate, the adhesive layer formed to be substantially enclosed in the substantially enclosed space;
   forming a plurality of light emitting elements, the plurality of light emitting elements formed on a side of the adhesive layer away from the stretchable base substrate;
   forming a plurality of gaps respectively between adjacent encapsulated islands of the plurality of encapsulated islands;
   forming an encapsulating layer encapsulating the plurality of encapsulated islands and the plurality of bridges;
   wherein a respective one of the plurality of encapsulated islands comprises at least one of the plurality of light emitting elements encapsulated therein on the stretchable base substrate;
   wherein the plurality of encapsulated islands and the plurality of bridges are formed to constitute a connected network;
   the flexible base wall is formed in a perimeter of the connected network, forming the substantially enclosed space extending throughout the connected network; and
   the adhesive layer is formed in the substantially enclosed space extending throughout the connected network;
   wherein the adhesive layer is absent in the plurality of gaps; and
   a respective one of the plurality of gaps is formed to be surrounded by a portion of the flexible base wall;
   wherein the encapsulating layer is formed to substantially cover an outer lateral side of the flexible base wall.

7. The method of claim 6, prior to forming the flexible base wall, further comprising:
   forming a flexible material layer on a first rigid base substrate;
   forming the plurality of light emitting elements on the flexible material layer, the plurality of light emitting elements formed in regions corresponding to the plurality of encapsulated islands, thereby forming an intermediate substrate comprising the plurality of light emitting elements; and
   etching through a plurality of layers of the intermediate substrate including the flexible material layer in regions between the adjacent encapsulated islands of the plurality of encapsulated islands, thereby forming a plurality of gap regions corresponding to the plurality of gaps.

8. The method of claim 7, subsequent to forming the encapsulating layer, further comprising:
   forming a sacrificial layer on a side of the encapsulating layer away from the first rigid base substrate; and
   adhering a side of the sacrificial layer away from the first rigid base substrate to a second rigid base substrate.

9. The method of claim 8, wherein the flexible material layer is etched to form an etched flexible material layer during etching the intermediate substrate;
   the etched flexible material layer substantially covers regions corresponding to the plurality of encapsulated islands and the plurality of bridges; and
   wherein, subsequent to adhering the side of the sacrificial layer away from the first rigid base substrate to the second rigid base substrate, the method further comprises:
   separating the etched flexible material layer from the first rigid base substrate, thereby exposing a surface of the etched flexible material layer; and
   subsequent to exposing the surface of the etched flexible material layer, etching the etched flexible material layer to form a flexible base wall substantially enclosing a substantially enclosed space;
   wherein forming the adhesive layer comprises filling an adhesive in the substantially enclosed space; and
   attaching the stretchable base substrate to the adhesive in the substantially enclosed space.

10. The method of claim 9, wherein the etched flexible material layer is etched incompletely through a thickness of the etched flexible material layer, thereby forming the flexible base wall and a flexible base pattern enclosing the substantially enclosed space;
   wherein the flexible base pattern is formed on a side of the adhesive layer away from the stretchable base substrate, the flexible base wall, the flexible base pattern, and the stretchable base substrate substantially enclosing the adhesive layer in the substantially enclosed space.

11. The method of claim 9, wherein the plurality of encapsulated islands and the plurality of bridges constitute a connected network;
   etching the etched flexible material layer to form the flexible base wall comprises etching the etched flexible material layer to form the substantially enclosed space extending throughout the connected network, the flexible base wall formed in a perimeter of the connected network; and
   the adhesive is filled in the substantially enclosed space extending throughout the connected network.

12. The method of claim 9, subsequent to attaching the stretchable base substrate to the adhesive in the substantially enclosed space, further comprising:
   removing the sacrificial layer, thereby separating the second rigid base substrate from the stretchable display panel.

* * * * *